United States Patent [19]
Takahashi et al.

[11] Patent Number: 5,255,279
[45] Date of Patent: Oct. 19, 1993

[54] SEMICONDUCTOR LASER DEVICE, AND A METHOD FOR PRODUCING A COMPOUND SEMICONDUCTOR DEVICE INCLUDING THE SEMICONDUCTOR LASER DEVICE

[75] Inventors: Kosei Takahashi; Masahiro Hosoda, both of Nara; Atsuo Tsunoda; Takahiro Suyama, both of Yamatokoriyama; Sadayoshi Matsui, Tenri, all of Japan

[73] Assignee: Sharp Kabushiki Kaisha, Osaka, Japan

[21] Appl. No.: 698,001

[22] Filed: May 9, 1991

[30] Foreign Application Priority Data

May 9, 1990 [JP] Japan ................... 2-120858
May 18, 1990 [JP] Japan ................... 2-129914
May 18, 1990 [JP] Japan ................... 2-129916

[51] Int. Cl.$^5$ ................................. H01S 3/19
[52] U.S. Cl. ........................... 372/46; 372/45
[58] Field of Search ......................... 372/45, 46

[56] References Cited

U.S. PATENT DOCUMENTS 5,058,120 10/1991 Nitta et al. ................ 372/45

FOREIGN PATENT DOCUMENTS 0196897 10/1986 European Pat. Off.
58-206172 12/1983 Japan.
63-104493 5/1988 Japan.
1-134985 5/1989 Japan.
1-37869 8/1989 Japan.
1-37870 8/1989 Japan.
1-37871 8/1989 Japan.
1-37873 8/1989 Japan.
2178595 2/1987 United Kingdom.

OTHER PUBLICATIONS

Ikeda et al., *Applied Physics Letters* (1985) 47(10):1027-1028.

T. Hayakawa et al., Journal of Crystal Growth, 95 (1989) pp. 343-347.

Primary Examiner—James W. Davie
Attorney, Agent, or Firm—Morrison & Foerster

[57] ABSTRACT

On a GaAs substrate $(Al_YGa_{1-Y})_{0.5}In_{0.5}P$ crystal layers $(0 \leq Y \leq 1)$ is formed to be lattice-matched with the substrate. By radiating As molecular beams on the surface of the crystal layers while heating the layered substrate to a temperature at which In in the crystal layers evaporates, the portion near the surface of the crystal layers is changed into an $Al_YGa_{1-Y}As$ crystal layer $(0 \leq Y \leq 1)$ of a thickness of several molecules, on which layer an $Al_XGa_{1-X}As$ crystal layer $(0 \leq X \leq 1)$ is formed. Since the surface of the $Al_YGa_{1-Y}As$ crystal layer has been purified, the formed $Al_XGa_{1-X}As$ crystal layer has a high crystallinity, allowing production of a light emitting diode, a semiconductor laser device and the like with high efficiency.

4 Claims, 8 Drawing Sheets

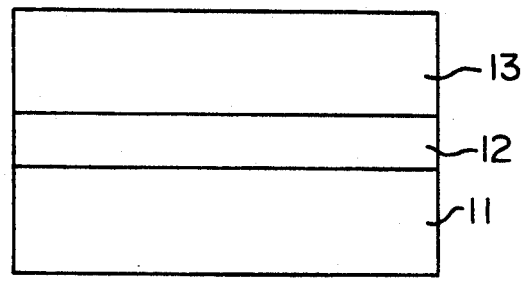
FIG. 2(a)
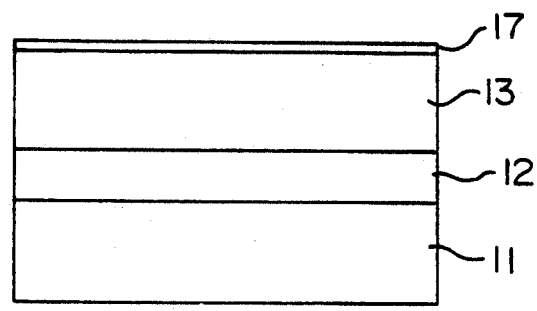
FIG. 2(b)
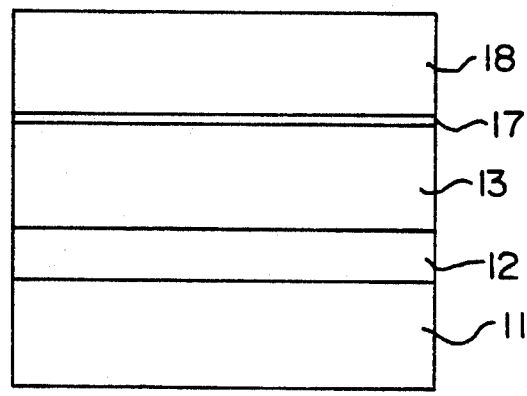
FIG. 2(c)

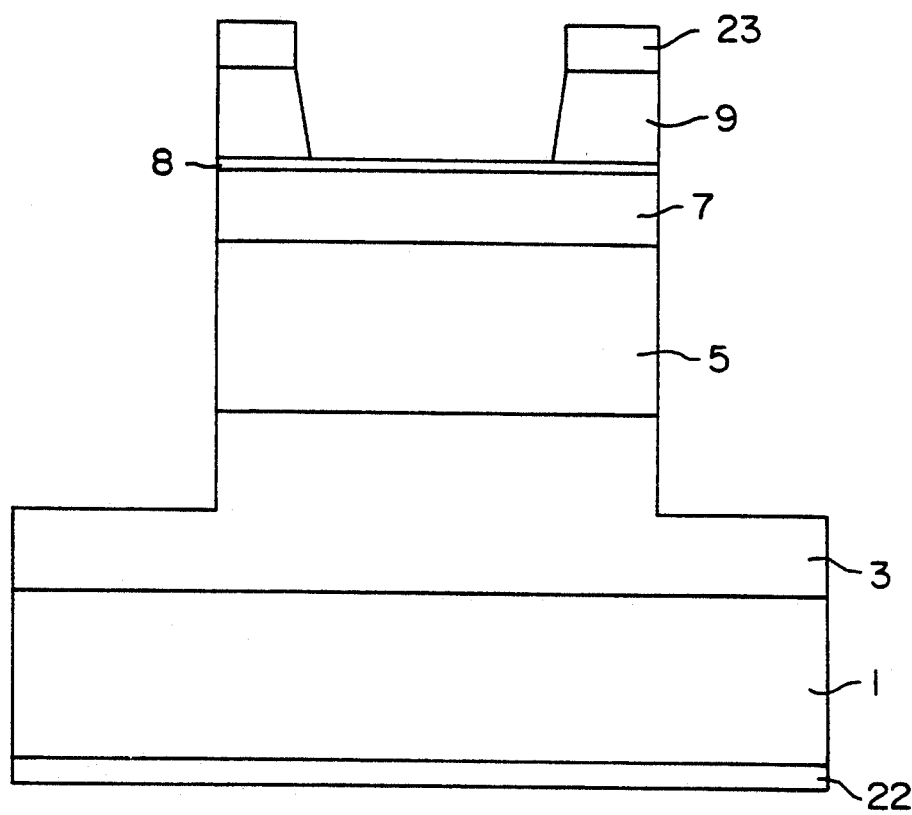

SEMICONDUCTOR LASER DEVICE, AND A METHOD FOR PRODUCING A COMPOUND SEMICONDUCTOR DEVICE INCLUDING THE SEMICONDUCTOR LASER DEVICE

BACKGROUND OF THE INVENTION

1. Field of the Invention

The present invention relates to a semiconductor laser device, and a method for producing a compound semiconductor device such as the semiconductor laser device and a light emitting diode (LED). More particularly, the present invention relates to a semiconductor laser device having an excellent temperature property allowing continuous oscillation of visible light beams at room temperature, and to a method for producing a compound semiconductor device in which a semiconductor layer of a III-V group compound is formed on a GaAs substrate with high crystallinity.

2. Description of the Prior Art

In recent years, in order to attain high efficiency in optical information processing systems, a semiconductor laser device capable of oscillating light beams in the range of short wavelengths is required. Particularly, an $(Al_YGa_{1-Y})_{0.5}In_{0.5}P$ crystal ($0 \leq Y \leq 1$) which lattice-matches a GaAs substrate has called attention in industries as a material for a visible light beam semiconductor laser capable of radiating light beams having a wavelength of the 600 nm band. The $(Al_YGa_{1-Y})_{0.5}In_{0.5}P$ ($0 \leq Y \leq 1$) is hereinafter referred to as AlGaInP unless otherwise specified.

The molecular beam epitaxy (MBE), as well as the metal organic chemical vapor deposition (MOCVD), have been anticipated to be important methods for epitaxial growth of the AlGaInP crystal on the GaAs substrate. It has been reported that an AlGaInP group visible light semiconductor laser device produced by MBE method continuously oscillated visible light beams at room temperature. (Hayaka et al, Journal of Crystal Growth 95(1989) pp.949)

FIG. 8 is a sectional view of a conventional AlGaInP group visible light semiconductor laser device produced by the MBE method.

A first conductivity type GaAs buffer layer 72, a first conductivity type GaInP buffer layer 73, a first conductivity type AlGaInP clad layer 74, a GaInP active layer 75, a second conductivity type AlGaInP second clad layer 76 and a second conductivity type GaInP layer 90 are formed on a first conductivity type GaAs substrate 71 in such a manner that one layer is grown on another in this order by the MBE method.

On the second conductivity type GaInP layer 90 is formed an insulation silicon nitride film 91 which has a 10 μm wide stripe groove extending to reach the second conductivity type GaInP layer 90.

Electrodes 85 and 84 are formed on the insulation silicon nitride film 91 and on the back surface of the substrate 71, respectively.

The semiconductor laser device shown in FIG. 8 is a gain guided semiconductor laser device in which current is confined by the insulation silicon nitride film 91 having the stripe groove. This semiconductor laser device has an oscillation threshold level of 93 mA and can continuously oscillate visible light beams at room temperature.

This type of the semiconductor laser device, however, can not effectively diffuse heat generated in the active layer at the time of oscillation due to the low thermal conductivity of the AlGaInP crystal. As a result, the maximum temperature for continuous oscillation is as low as 35° C.

A semiconductor laser device having not only a structure of effective heat emission but also a double hetero structure composed of AlGaInP crystal layers lattice-matched with a GaAs substrate will be produced if an AlGaAs crystal layer with comparatively high thermal conductivity and effective heat emission can be formed on the AlGaInP crystal layers by the MBE method.

However, the AlGaAs crystal layer with high crystallinity may not be formed on the AlGaInP crystal layers lattice-matched with the GaAs substrate by the MBE method if the surface of the AlGaInP crystal layer is contaminated by impurities.

When the AlGaInP crystal layers and the AlGaAs crystal layer are continuously formed by the MBE method, the molecular beam radiation must be switched from P to As. The above contamination occurs at the time when the layer growth is temporarily stopped for this switching after the growth of the AlGaInP crystal layers is completed. In several seconds after stopping, impurities such as oxygen and steam in the atmosphere inside a MBE apparatus attach themselves to the surface of the crystal layer on which the growth is temporarily stopped.

Moreover, in order to grow the AlGaAs layer of high quality by the MBE method, the temperature of the substrate must be raised to about 620° C. or higher. At such temperatures, In and P in the AlGaInP layers actively evaporate, causing to deteriorate the surface of the AlGaInP crystal layers. It is not possible to grow the AlGaAs crystal layer with high crystallinity on the deteriorated surface of the AlGaInP crystal layers.

Furthermore, the semiconductor laser device having the AlGaInP crystal layers grown by the MBE method is normally of a gain-guided type as shown in FIG. 8. In the gain-guided semiconductor laser device, the horizontal transverse mode of laser beams can not be fully controlled. Therefore, the development of an index-guided semiconductor laser device which can stabilize the horizontal transverse mode of laser beams is required also for the semiconductor laser device having AlGaInP crystals.

FIG. 9 is a sectional view of a conventional index-guided semiconductor laser device. A first conductivity type GaAs buffer layer 72, a first conductivity type AlGaInP first clad layer 74, a GaInP active layer 75, a second conductivity type AlGaInP second clad layer 76, a second conductivity type GaAs layer 78 and a second conductivity type InGaAs layer 100 are formed on a first conductivity type GaAs substrate 71 in such a manner that one layer is grown on another in this order by the MBE method.

The GaInP active layer 75, the second conductivity type AlGaInP second clad layer 76, the second conductivity type GaAs layer 78 and the second conductivity type InGaAs layer 100 are etched to form a 10 μm wide ridge. This ridged surface is covered with a silicon oxide layer 101 except the top portion thereof. Electrodes 85 and 84 are then formed over the top ridged surface and on the back surface of the substrate 71, respectively.

In the semiconductor laser device of the above described structure, current flows between the electrodes 85 and 84 through the top portion of the ridge where the silicon oxide layer 101 is not formed. And, the presence of the 10 μm wide thin active layer 75 enables the oscillation at a unified horizontal transverse mode.

However, the semiconductor laser device of this structure is disadvantageous in that heat generated in the active layer 75 is not efficiently emitted outside the device due to the presence of recesses on the ridged surface formed by etching, as a result preventing continuous oscillation at room temperature.

SUMMARY OF THE INVENTION

The method for producing a compound semiconductor device, which overcomes the above-discussed and numerous other disadvantages and deficiencies of the prior art, comprises the steps of forming on a GaAs substrate an $(Al_YGa_{1-Y})_{0.5}In_{0.5}P$ crystal layer $(0 \leq Y \leq 1)$ which lattice-matches with the GaAs substrate, radiating As molecular beams on the surface of the crystal layer while heating the layered substrate to a temperature at which In in the crystal layer evaporates so as to change the surface of the crystal layer to an $Al_YGa_{1-Y}As$ crystal layer $(0 \leq Y \leq 1)$ of a thickness of several molecules, and forming a $Al_XGa_{1-X}As$ crystal layer $(0 \leq X \leq 1)$ on the $Al_YGa_{1-Y}As$ crystal layer.

In a preferred embodiment, the compound semiconductor device is a light emitting diode.

In another preferred embodiment, the compound semiconductor device is a semiconductor laser.

In a still preferred embodiment, the compound semiconductor device is a pin-type photodiode.

According to another aspect of the present invention, the semiconductor laser device comprises a GaAs substrate, a double hetero structure composed of AlGaInP crystals formed on the GaAs substrate, an $(Al_XGa_{1-X})_{0.5}In_{0.5}P$ etching stop layer $(0 \leq X \leq 1)$ formed on the double hetero structure, a GaAs optical absorption layer formed on the etching stop layer and having a stripe groove extending therethrough to reach the etching stop layer, and a regrowing AlGaAs layer formed on the etching stop layer and the GaAs optical absorption layer in such a manner so as to fill up the stripe groove, wherein the etching stop layer and the regrowing AlGaAs layer have a band gap energy greater than an optical energy generated within the double hetero structure.

In a preferred embodiment, another $(Al_YGa_{1-Y})_{0.5}In_{0.5}P$ etching stop layer $(0 \leq Y \leq 1)$ is formed between the top surface of the GaAs optical absorption layer and the bottom surface of the AlGaAs layer.

According to another aspect of the present invention, the method for producing a semiconductor laser device comprises the steps of forming a double hetero structure composed of AlGaInP crystals on a GaAs substrate, forming an $(Al_XGa_{1-X})_{0.5}In_{0.5}P$ etching stop layer $(0 \leq X \leq 1)$ on the double hetero structure, the etching stop layer having a band gap energy greater than an optical energy generated within the double hetero structure, forming a GaAs optical absorption layer on the etching stop layer, forming a stripe groove extending through the GaAs optical absorption layer to reach the etching stop layer, radiating As molecular beams on the layered substrate in a MBE apparatus while heating the layered substrate to exceed a temperature at which In and P in the etching stop layer evaporate so as to change the exposed portion near the surface of the etching stop layer in the stripe groove into an $Al_XGa_{1-X}As$ layer of a thickness of several molecules, and forming an AlGaAs layer on the $Al_XGa_{1-X}As$ layer and the GaAs optical absorption layer in such a manner so as to fill up the stripe groove in the MBE apparatus, the AlGaAs layer having a band gap energy greater than an optical energy generated within the double hetero structure.

According to still another aspect of the present invention, the method for producing a semiconductor laser device comprises the steps of forming a double hetero structure composed of AlGaInP crystals on a GaAs substrate, forming an $(Al_XGa_{1-X})_{0.5}In_{0.5}P$ etching stop layer $(0 \leq X \leq 1)$ on the double hetero structure, the etching stop layer having a band gap energy greater than an optical energy generated within the double hetero structure, forming a GaAs optical absorption layer on the $(Al_XGa_{1-X})_{0.5}In_{0.5}P$ etching stop layer, forming an $(Al_YGa_{1-Y})_{0.5}In_{0.5}P$ etching stop layer $(0 \leq Y \leq 1)$ on the GaAs optical absorption layer, forming a stripe groove extending through the $(Al_YGa_{1-Y})_{0.5}In_{0.5}P$ etching stop layer and the GaAs optical absorption layer to reach the $(Al_XGa_{1-X})_{0.5}In_{0.5}P$ etching stop layer, radiating As molecular beams on the layered substrate in a MBE apparatus while heating the layered substrate to exceed a temperature at which In and P in the etching stop layers evaporate so as to change the exposed portions near the surface of the etching stop layers into an $Al_XGa_{1-X}As$ layer and an $Al_YGa_{1-Y}As$ layer of a thickness of several molecules, and forming an AlGaAs layer on the $Al_XGa_{1-X}As$ layer and the $Al_YGa_{1-Y}As$ layer in such a manner so as to fill up the stripe groove in the MBE apparatus, the AlGaAs layer having a band gap energy greater than an optical energy generated within the double hetero structure.

According to still another aspect of the present invention, the method for producing a semiconductor laser device comprises the steps of forming a double hetero structure composed of AlGaInP crystals on a GaAs substrate, forming an $(Al_XGa_{1-X})_{0.5}In_{0.5}P$ etching stop layer $(0 \leq X \leq 1)$ on the double hetero structure, the etching stop layer having a band gap energy greater than an optical energy generated within the double hetero structure, forming a GaAs optical absorption layer on the etching stop layer, forming a stripe groove on the GaAs optical absorption layer having a depth not to reach the etching stop layer, radiating As molecular beams on the multi-layered substrate in a MBE apparatus while heating the substrate to exceed a temperature at which GaAs in the GaAs layer remaining on the surface of the optical absorption layer evaporates so that the etching stop layer is exposed inside the stripe groove and the portion near the exposed surface of the etching layer is changed into an AlAs layer of a thickness of several molecules, and forming an AlGaAs layer on the AlAs layer and the GaAs optical absorption layer in such a manner so as to fill up the stripe groove in the MBE apparatus, the AlGaAs layer having a band gap energy greater than an optical energy generated within the double hetero structure.

According to still more another aspect of the present invention, the method for producing a semiconductor laser device comprises the steps of forming on a GaAs substrate a double hetero structure composed of AlGaInP crystal layers which lattice-matches the GaAs substrate, forming a GaInP etching stop layer on the double hetero structure, forming an optical absorption layer on the GaInP etching stop layer, radiating As molecular beams on the GaInP etching stop layer inside the stripe groove in a MBE apparatus while heating the layered substrate to a temperature at which In and P in the GaInP etching stop layer evaporate so as to change the portion near the surface of the GaInP etching stop layer on which the As molecular beams were radiated into a GaAs layer of a thickness of several molecules, and forming an AlGaAs layer on the GaAs layer and on the optical absorption layer in the MBE apparatus, the AsGaAs layer having a band gap energy greater than an optical energy generated within the double hetero structure.

According to still more another aspect of the present invention, the method for producing a semiconductor laser device comprises the steps of forming on a GaAs substrate a double hetero structure composed of AlGaInP crystal layers which lattice-matches the GaAs substrate, forming a first GaInP etching stop layer on the double hetero structure, forming an optical absorption layer on the first GaInP etching stop layer, forming a second GaInP etching stop layer on the optical absorption layer and a stripe groove by etching selectively the second GaInP etching stop layer and the optical absorption layer to reach the first GaInP etching stop layer, radiating As molecular beams on the first and second GaInP etching stop layers in a MBE apparatus while heating the layered substrate to a temperature at which In and P in the first and second GaInP etching stop layers evaporate so as to change the portion near the surface of each GaInP etching stop layer on which the As molecular beams were radiated into a GaAs layer of a thickness of several molecules, and forming an AlGaAs layer on the GaAs layer in the MBE apparatus, the AsGaAs layer having a band gap energy greater than an optical energy generated within the double hetero structure.

According to another aspect of the present invention, the semiconductor laser device comprises a GaAs substrate, a double hetero structure formed on the GaAs substrate and composed of AlGaInP crystal layers which lattice-match with the GaAs substrate, a GaInP etching stop layer formed on the double hetero structure, an optical absorption layer formed on the GaInP etching stop layer and having a stripe groove extending therethrough to reach the GaInP etching stop layer, and an AlGaAs layer formed on the optical absorption layer and the GaInP etching stop layer, wherein the thickness of the GaInP etching stop layer is smaller than an electron de Broglie wavelength, and the band gap energy of the AlGaAs layer is greater than an optical energy generated within the double hetero structure.

In a preferred embodiment, a second GaInP etching stop layer is formed on the optical absorption layer.

In the method for producing the compound semiconductor device according to the present invention, As molecular beams are radiated on the surface of the $(Al_YGa_{1-Y})_{0.5}In_{0.5}P$ crystal layer $(0 \leq Y \leq 1)$ lattice-matched with the GaAs substrate, while the temperature of the substrate is raised to a temperature at which In in the crystal layer evaporates, thus changing the surface of the crystal layer into an $Al_YGa_{1-Y}As$ crystal layer $(0 \leq Y \leq 1)$ of a thickness of several molecules. In this way, the surface of the $(Al_YGa_{1-Y})_{0.5}In_{0.5}P$ crystal layer is purified, at the same time preventing In and P from vaporing from the $(Al_YGa_{1-Y})_{0.5}In_{0.5}P$ crystal layer. Also if an $Al_XGa_{1-X}As$ crystal layer $(0 \leq X \leq 1)$ of a thickness of several molecules is formed on the $Al_YGa_{1-Y}As$ crystal layer, the surface of the $Al_YGa_{1-Y}As$ crystal layer is purified, allowing obtaining high crystallinity of the $Al_XGa_{1-X}As$ crystal layer. Thus, the method for producing the compound semiconductor device according to the present invention can provide a high quality compound semiconductor device having the $Al_XGa_{1-X}As$ crystal layer of high crystallinity formed on the $(Al_YGa_{1-Y})_{0.5}In_{0.5}P$ crystal layer.

Furthermore, In the method for producing the compound semiconductor device according to the present invention, the surface of the GaInP etching stop layer is purified in the MBE apparatus and the thermally stable GaAs layer is formed thereon before the AlGaAs layer is formed. This enables the AlGaAs layer of high crystallinity to be formed on the GaAs layer. In this way, the method of the present invention can present a visible light semiconductor laser device which can reduce optical absorption loss at the stripe groove and have a low threshold current.

The semiconductor laser device according to the present invention includes the AlGaAs layer having relatively high thermal conductivity, which enables heat generated inside the double hetero structure comprising AlGaInP to be efficiently diffused outside the semiconductor laser device. Further, the semiconductor laser device of this invention, which is of the index-guided having the stripe groove inside, is provided with an excellent temperature property, allowing continuous oscillation of visible light beams of the unified horizontal transverse mode at room temperature. The GaInP etching stop layer does not include an active Al, which can prevent the layer from being easily contaminated.

Thus, the invention described herein makes possible the objectives of (1) providing a method for producing a high quality compound semiconductor device in which an $Al_XGa_{1-X}As$ crystal layer of high crystallinity is easily formed on a deteriorated surface of an $(Al_YGa_{1-Y})_{0.5}In_{0.5}P$ crystal layer, and (2) providing a semiconductor laser device having a structure of presenting excellent heat diffusion and capable of continuously oscillating visible light beams at room temperature.

BRIEF DESCRIPTION OF THE DRAWINGS

This invention may be better understood and its numerous objects and advantages will become apparent to those skilled in the art by reference to the accompanying drawings as follows:

FIGS. 2(a) to 2(c) are sectional views showing the steps of the method for producing a light emitting device of the second embodiment according to the present invention;

FIG. 4 is a sectional view showing a pin-type photodiode produced according to the fourth embodiment of the present invention;

Referring to FIG. 1, a producing method of a light emitting device such as a light emitting diode according to the present invention is described as follows.

As shown in FIG. 1(a), a GaAs buffer layer 12 and an $(Al_{0.7}Ga_{0.3})_{0.5}In_{0.5}P$ layer 14 are formed on a GaAs substrate 11 in such a manner that one layer is grown on another in this order by the MBE method. The substrate temperature at this stage is 510° C.

Figure 1A:
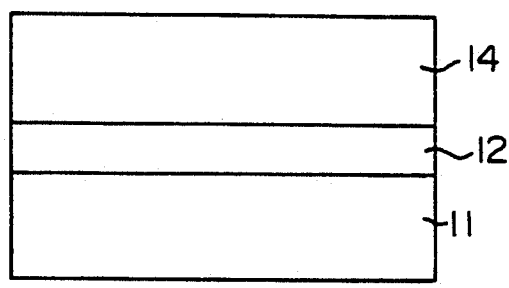
FIGS. 1(a) to 1(c) are sectional views showing the steps of the method for producing a light emitting device of the first embodiment according to the present invention.
Figure 1B:
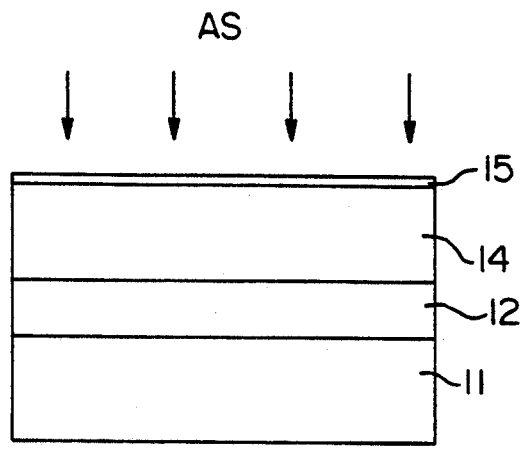

Next, after the radiation of P molecular beams is stopped, As molecular beams are radiated on the $(Al_{0.7}Ga_{0.3})_{0.5}In_{0.5}P$ layer 14 as shown in FIG. 1(b), while the substrate temperature is raised to 620° C. This condition is maintained for several minutes.

As a result, In and P near the surface of the $(Al_{0.7}Ga_{0.3})_{0.5}In_{0.5}P$ layer 14 are replaced with As in the As molecular beams, changing the upper portion near the surface of the layer 14 to an $Al_{0.7}Ga_{0.3}As$ layer 15 of a thickness of several molecules.

This $Al_{0.7}Ga_{0.3}As$ layer 15 is thermally stable at a temperature below about 680° C., seldom causing evaporation of the composing elements thereof. Thus, the evaporation of In and P from the layer 14 that is normally active at around 620° C. is avoided by being covered with the $Al_{0.7}Ga_{0.3}As$ layer 15 of a thickness of several molecules. As a result, deterioration of the layer 14 which is caused by In and P evaporation and which is most eminent at a temperature around 580° C. or higher can be prevented even at a temperature as high as 620° C.

Figure 1C:
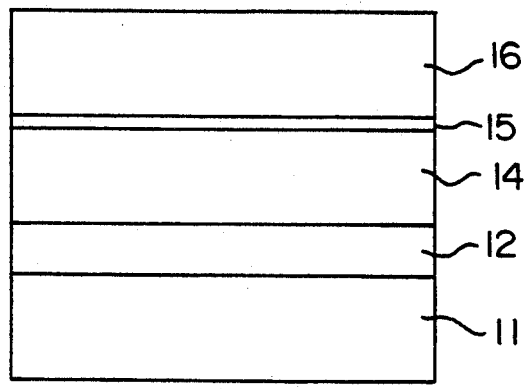

Continuously after the formation of the $Al_{0.7}Ga_{0.3}As$ layer 15, an $Al_{0.4}Ga_{0.6}As$ layer 16 is grown on the $Al_{0.7}Ga_{0.3}As$ layer 15 as shown in FIG. 1(c). The growth of the $Al_{0.4}Ga_{0.6}As$ layer 16 is made by the normal MBE method in which Al and Ga molecular beams in addition to the As molecular beams are radiated on the layered substrate. At this stage, the substrate temperature is 620° C. A light emitting device is thus produced.

The efficiency of the light emitting device produced by the above described method was tested by comparing the photoluminescence of the $Al_{0.4}Ga_{0.6}As$ layer 16 with that of the same layer of a light emitting device produced as a comparative example by a method in which the above second step of radiating As molecular beams while raising the substrate temperature to 620° C. is excluded from the above-described method. The result was that the luminescence intensity of the light emitting device of this example was several times as large as that of the light emitting device of the comparative example, indicating that the crystallinity of the $Al_{0.4}Ga_{0.6}As$ layer 16 of this example are superior to that of the same layer of the comparative example.

One reason why the $Al_{0.4}Ga_{0.6}As$ layer 16 having high crystallinity can be obtained by the method of the present invention is that, as mentioned above, the formation of the $Al_{0.7}Ga_{0.3}As$ layer 15 can protect the $(Al_{0.7}Ga_{0.3})_{0.5}In_{0.5}P$ layer 14 from deterioration caused by evaporation of In and P therein.

The other reason is that during the above second step In and P near the surface of the $(Al_{0.7}Ga_{0.3})_{0.5}In_{0.5}P$ layer 14 are replaced with As in the As molecular beams, removing impurities such as oxides present near the surface of the layer 14 and purifying that area. That is, if the $(Al_{0.7}Ga_{0.3})_{0.5}In_{0.5}P$ layer 14 is contaminated by impurities such as oxygen and steam in the atmosphere inside the MBE apparatus during the inactive time of several seconds between the stop of radiation of P molecular beams and the start of radiation of As molecular beams, such contamination is purified by replacement of In and P in the contaminated area with As. As a result, the problem of contamination of the crystal surface at switching of the molecular beam radiation is resolved.

Example 2

Referring to FIG. 2, the second example of a method for producing a light emitting device according to the present invention is described as follows.

As shown in FIG. 2(a), a GaAs buffer layer 12 and a GaInP layer 13 are formed on a GaAs substrate 11 in such a manner that one layer is grown on another in this order by the MBE method. The substrate temperature at this stage is in the range of 450° C. and 570° C.

Then, the layered substrate is taken out of the MBE apparatus for observation of the surface of the grown crystal surface, and returned to the MBE apparatus. Next, As molecular beams are radiated on the GaInP layer 13 as shown in FIG. 2(b), while the substrate temperature is raised to 620° C. This condition is maintained for several minutes.

As a result, In and P near the surface of the GaInP layer 13 are replaced with As in the As molecular beams, changing the upper portion near the surface of the GaInP layer 13 to a GaAs layer 17 of a thickness of several molecules.

This thin GaAs layer 17 is thermally stable at a temperature below about 680° C., seldom causing evaporation of the composing elements thereof. Thus, the evaporation of In and P from the GaInP layer 13 which is normally active at around 620° C. is avoided by being covered by the GaAs layer 17 of a thickness of several molecules. As a result, deterioration of the GaInP layer 13 which is caused by In and P and which is most eminent at a temperature around 580° C. or higher can be prevented even at a temperature as high as 620° C.

Continuously after the formation of the GaAs layer 17, an $Al_{0.7}Ga_{0.3}As$ layer 18 is grown on the GaAs layer 17 as shown in FIG. 2(c). The growth of the $Al_{0.7}Ga_{0.3}As$ layer 18 is made by the normal MBE method in which Al and Ga molecular beams in addition to the As molecular beams are radiated on the layered substrate. At this stage, the substrate temperature is 690° C.

The thus formed AlGaAs layer 18 has showed the same high crystallinity as the AlGaAs layer 16 of Example 1.

Example 3

Referring to FIG. 3, a method for producing a semiconductor device according to the present invention is described as follows.

Figure 3A:
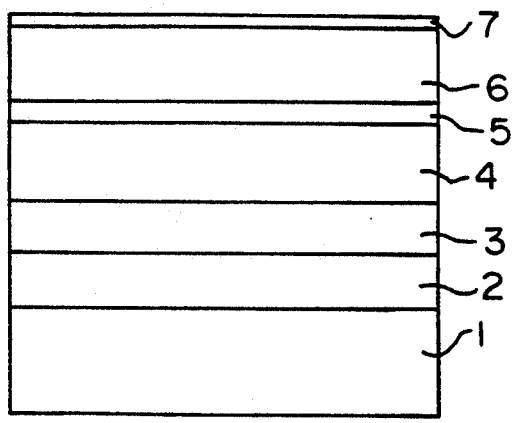
FIGS. 3(a) to 3(c) are sectional views showing the steps of the method for producing a light emitting device of the third embodiment according to the present invention.

As shown in FIG. 3(a), a first conductivity type GaAs buffer layer 2, a first conductivity type GaInP buffer layer 3, a first conductivity type AlGaInP clad layer 4, a GaInP active layer 5, a second conductivity type AlGaInP second clad layer 6 and a second conductivity type GaInP layer 7 are formed on a first conductivity type GaAs substrate 1 in such a manner that one layer is grown on another in this order by the MBE method. The growth of each layer is made inside the MBE apparatus using P as the molecular beam source by the normal MBE method. The substrate temperature at this stage is 510° C., and the thickness of the second conductivity type GaInP layer 7 is 10 nm.

Next, the layered substrate is taken out of the MBE apparatus and entered into another MBE apparatus using As as the molecular beam source. Then, As molecular beams are radiated on the second conductivity type GaInP layer 7, while the substrate temperature is raised to 620° C. This condition is maintained for several minutes.

Figure 3B:
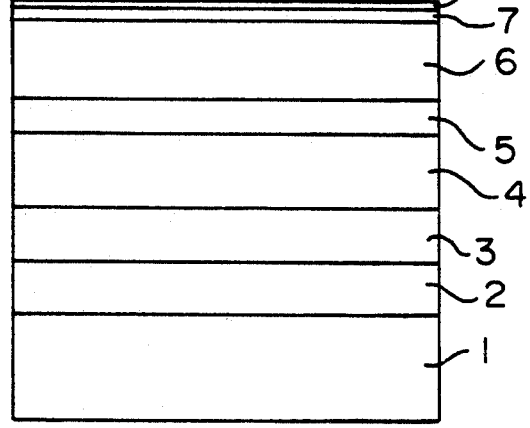

As a result, as shown in FIG. 3(b), In and P near the surface of the GaInP layer 7 are replaced with As in the As molecular beams, changing the upper portion near the surface of the GaInP layer 7 to a GaAs layer 8 of a thickness of several molecules.

After the formation of the GaAs layer 8, a second conductivity type GaAs cap layer 9 is grown on the GaAs layer 8 by the MBE method. Then, an insulation silicon nitride film 21 is grown on the cap layer 9 by the plasma-activated CVD method. By photo etching of the silicon nitride film 21 is formed a 10 μm wide stripe groove extending therethrough to reach the second conductivity type GaAs cap layer 9.

Figure 3C:
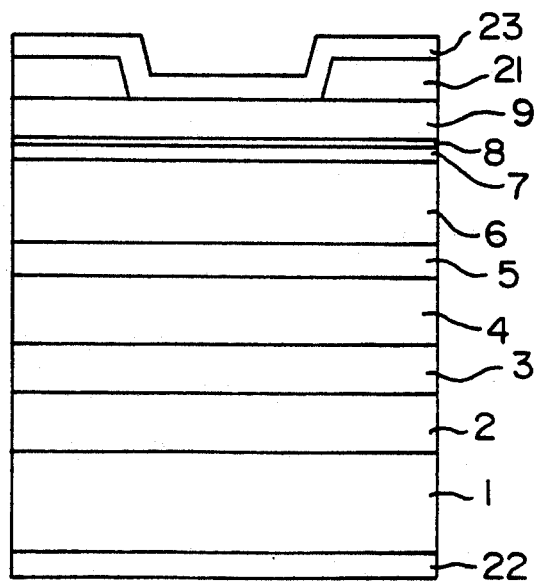

Finally, electrodes 23 and 22 are formed on the top surface of the thus formed layers and on the back surface of the substrate 1, respectively, to produce a gain guided semiconductor laser device as shown in FIG. 3(c).

Figure 8:
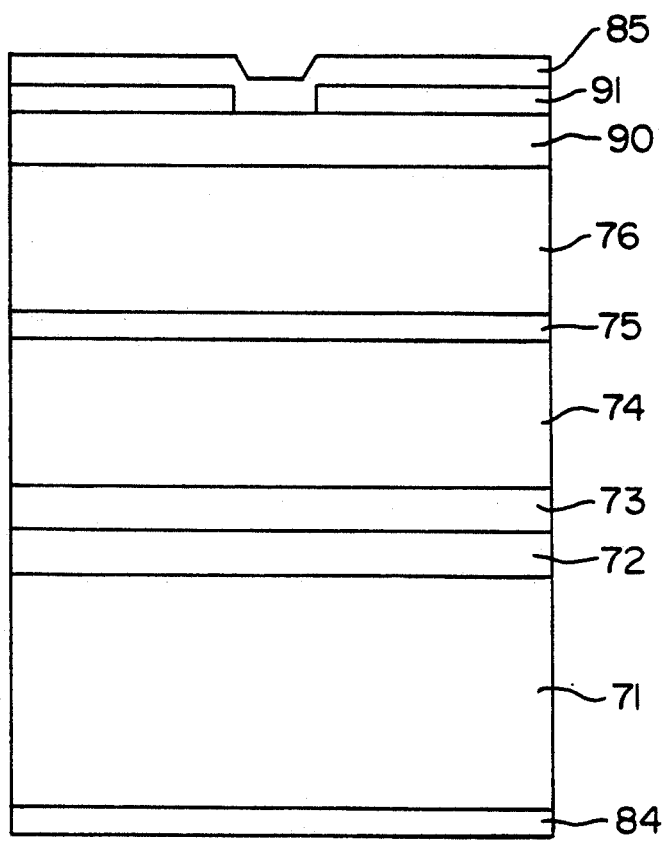
FIG. 8 is a sectional view showing a conventional semiconductor laser.
Figure 9:
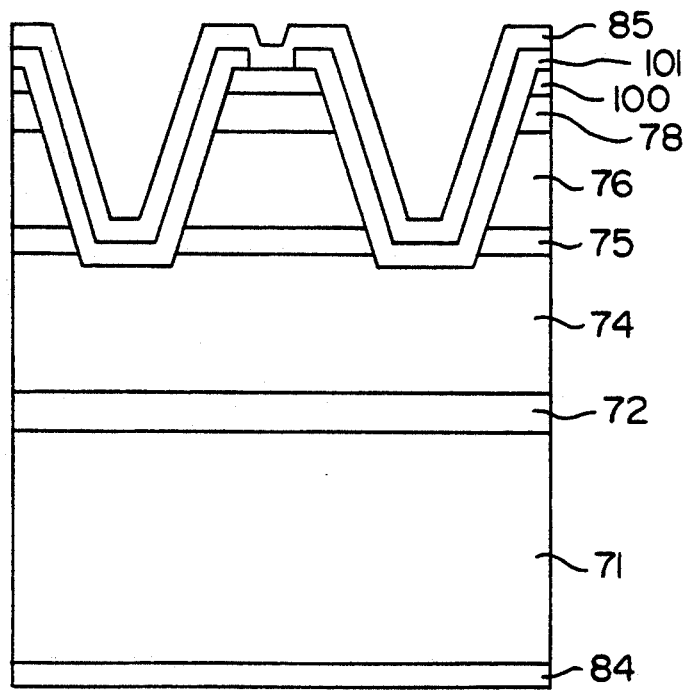
FIG. 9 is a sectional view showing another conventional semiconductor laser. DESCRIPTION OF THE PREFERRED EMBODIMENT Example 1

The semiconductor laser device produced as described above is provided with the second conductivity type GaAs cap layer 9 including GaAs which has higher thermal conductivity than GaInP, allowing heat generated in the active layer 5 to be efficiently diffused outside the semiconductor laser device. As a result, the semiconductor laser device of this example can show an excellent temperature property, compared with the one shown in FIG. 8, enabling continuous oscillation of 670 nm wavelength light beams at room temperature.

In a comparative example of a semiconductor laser device produced by the same method described above except excluding the step of radiating As molecular beams while raising the substrate temperature to 620° C., continuous oscillation at room temperature was not possible because the threshold current increased The reason is that the surface of a second conductivity type GaInP layer of the comparative example was not sufficiently purified inside the MBE apparatus after being contaminated in the atmosphere and had a crystal layer formed thereon. As a result, the formed crystal layer could not have high crystallinity and therefore the radiative efficiency of laser beams was low compared with that of the semiconductor laser device of Example 3.

Example 4

Referring to FIG. 4, a method for producing a pin-type photodiode according to the present invention is described as follows.

As shown in FIG. 4, a first conductivity type GaInP buffer layer 3, a GaInP active layer 5 and a second conductivity type GaInP layer 7 are formed on a first conductivity type GaAs substrate 1 in such a manner that one layer is grown on another in this order by the MBE method. The growth of each layer is made inside the MBE apparatus using P as the molecular beam source by the normal MBE method.

Next, the layered substrate is taken out of the MBE apparatus and entered into another MBE apparatus using As as the molecular beam source. Then, As molecular beams are radiated on the second conductivity type GaInP layer 7, while the substrate temperature is raised to 620° C. This condition is maintained for several minutes.

As a result, In and P near the surface of the GaInP layer 7 are replaced with As in the As molecular beams, changing the upper portion near the surface of the GaInP layer 7 to a GaAs layer 8 of a thickness of several molecules.

After the formation of the GaAs layer 8, a second conductivity type GaAs layer 9 is grown on the GaAs layer 8. Then, electrodes 23 and 22 are formed on the top surface of the second conductivity type GaAs layer 9 and on the back surface of the substrate 1, respectively.

Then, a predetermined portion of the electrode 23 and the second conductivity type GaAs layer 9 are etched to reach the surface of the GaAs layer 8 so as to form a light-receiving portion of the photodiode.

Further, predetermined portions of the electrode 23, the second conductivity type GaAs layer 9, the GaAs layer 8, the GaInP layer 7, the GaInP active layer 5 and the first conductivity type GaInP buffer layer 3 are etched to produce the pin-type photodiode as shown in FIG. 4.

The sensitivity of the thus produced pin-type photodiode proved to be superior to that of a pin-type photodiode produced in the same method except excluding the step of radiating As molecular beams on the layer 7 and raising the substrate temperature to 620° C. This is because, according to the method of Example 4, formation of the surface state is reduced even on the surface where the layer growth is temporarily stopped.

Example 5

Figure 5A:
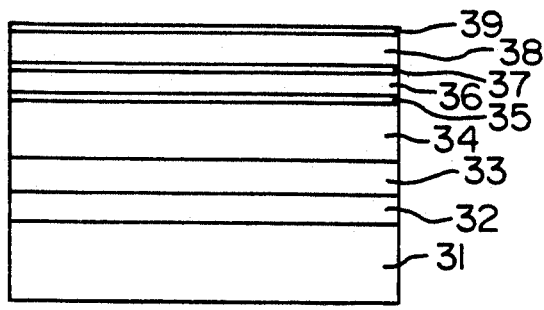
FIGS. 5(a) to 5(d) are sectional views showing the steps of the method for producing a semiconductor laser device of an embodiment according to the present invention.
Figure 5B:
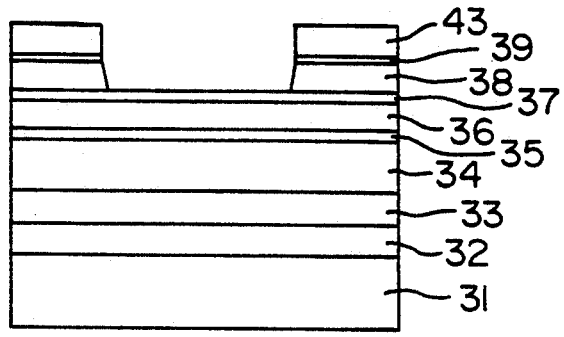
Figure 5C:
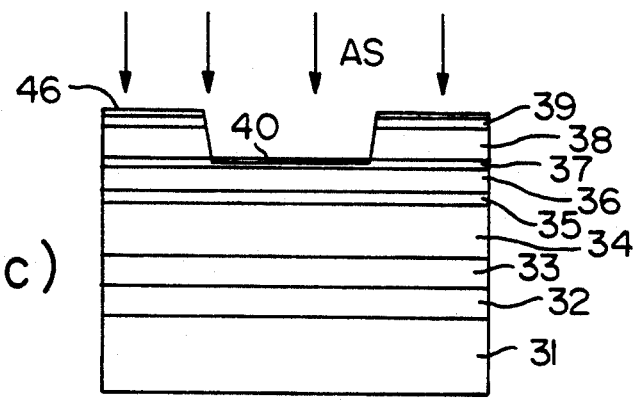
Figure 5D:
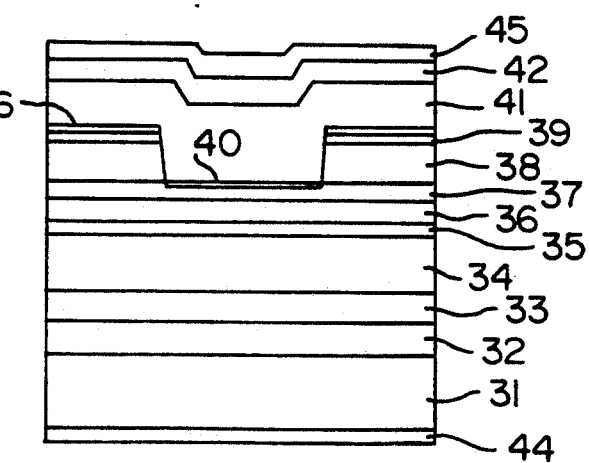

FIG. 5(d) is a sectional view of one example of the semiconductor laser device according to the present invention. The semiconductor laser device comprises a first conductivity type GaAs buffer layer 32, a first conductivity type GaInP buffer layer 33, a first conductivity type AlGaInP clad layer 34, a GaInP active layer 35, a second conductivity type AlGaInP clad layer 36, an $(Al_{0.7}Ga_{0.3})_{0.5}In_{0.5}P$ first etching stop layer 37, a GaAs optical absorption layer 38 and an $(Al_{0.4}Ga_{0.6})_{0.5}In_{0.5}P$ second etching stop layer 39 formed on a first conductivity type GaAs substrate 31 in this order.

A stripe groove (5 μm width) is formed through the $(Al_{0.4}Ga_{0.6})_{0.5}In_{0.5}P$ second etching stop layer 39 and the GaAs optical absorption layer 38 to reach the $(Al_{0.7}Ga_{0.3})_{0.5}In_{0.5}P$ first etching stop layer 37.

An $Al_{0.7}Ga_{0.3}As$ layer 40 of a thickness of several molecules is formed on the surface of the first etching stop layer 37 exposed inside the stripe groove. Also, a $Al_{0.4}Ga_{0.6}As$ layer 46 of a thickness of several molecules is formed on the surface of the second etching stop layer 39.

A second conductivity type $Al_{0.7}Ga_{0.3}As$ regrowing clad layer 41 is formed over the GaAs layer 38, the $Al_{0.7}Ga_{0.3}As$ layer 40 and the $Al_{0.4}Ga_{0.6}As$ layer 46 in such a manner that the stripe groove is filled up.

In the semiconductor laser device of this structure, the first conductivity type AlGaInP clad layer 34, the GaInP active layer 35 and the second conductivity type AlGaInP clad layer 36 constitute a double hetero structure, and therefore most light beams generated inside the active layer 35 are confined within this double hetero structure.

The band gap energy in the GaAs layer 38 positioned on the both sides of the stripe groove is smaller than the energy of light beams generated in the active layer 35. Therefore, the GaAs layer 38 comparatively easily absorbs the light beams. On the other hand, the $Al_{0.7}Ga_{0.3}As$ regrowing clad layer 41 is made to have a sufficiently large band gap and a sufficiently small refractive index required to confine the light beams generated in the active layer 35 within the double hetero structure. This results in producing an effective refractive index difference between the inside and the outside of the stripe groove formed above the double hetero structure, and thus the horizontal transverse mode of laser beams is unified.

A second conductivity type GaAs cap layer 42 is formed on the second conductivity type $Al_{0.7}Ga_{0.3}As$ regrowing clad layer 41, and electrodes 45 and 44 are formed on the surface of the second conductivity type GaAs cap layer 42 and on the back surface of the substrate 32, respectively.

Next, referring to FIGS. 5(a) to 5(d), the method for producing the semiconductor laser device of this example is described as follows.

As shown in FIG. 5(a), the first conductivity type GaAs buffer layer 32, the first conductivity type GaInP buffer layer 33, the first conductivity type AlGaInP clad layer 34, the GaInP active layer 35, the second conductivity type AlGaInP clad layer 36, the $(Al_{0.7}Ga_{0.3})_{0.5}In_{0.5}P$ first etching stop layer 37, the GaAs optical absorption layer 38 and the $(Al_{0.4}Ga_{0.6})_{0.5}In_{0.5}P$ second etching stop layer 39 are formed on the first conductivity type GaAs substrate 31 in such a manner that one layer is continuously grown on another in this order by the MBE method. The substrate temperature at this stage is in the range of about 480° C. and about 570° C.

During the above step, the substrate 31 should not be moved outside the MBE apparatus to in order to keep the growing layers clean.

The total thickness of the second conductivity type AlGaInP second clad layer 36 and the second conductivity type $(Al_{0.7}Ga_{0.3})_{0.5}In_{0.5}P$ first etching stop layer 37 is as small as about 200 nm so that light beams generated in the active layer 35 can be transmitted to the GaAs optical absorption layer 38.

After the layer 39 has been formed, the layered substrate is taken out of the MBE apparatus. Some portions of the $(Al_{0.4}Ga_{0.6})_{0.5}In_{0.5}P$ second etching stop layer 39 and the GaAs optical absorption layer 38 are selectively etched using a photo mask 43 to form a stripe groove extending to reach the $(Al_{0.7}Ga_{0.3})_{0.5}In_{0.5}P$ first etching stop layer 37 (FIG. 5(b)).

During this step of etching made outside the MBE apparatus, impurities such as oxygen and steam in the atmosphere attach and contaminate the surface of the $(Al_{0.7}Ga_{0.3})_{0.5}In_{0.5}P$ second conductivity type first etching stop layer 37. The contaminated surface of the layer 37 deteriorates the crystallinity of other layers to be grown thereon. To prevent this trouble and to purify the surfaces of the $(Al_{0.7}Ga_{0.3})_{0.5}In_{0.5}P$ first etching stop layer 37 and the $(Al_{0.4}Ga_{0.6})_{0.5}In_{0.5}P$ second etching stop layer 39, the layered substrate is returned to the MBE apparatus where the layer 37 and the layer 39 are exposed to a sufficient amount of As molecular beams while the substrate temperature is raised to 620° C. The condition is maintained for several minutes.

By this operation In and P present near the surfaces of the layer 37 and the layer 39 are replaced with As in the As molecular beams, changing the portions near the surfaces of these layers 37 and 39 to the $Al_{0.7}Ga_{0.3}As$ layer 40 and the $Al_{0.4}Ga_{0.6}As$ layer 46 of a thickness of several molecules, respectively (FIG. 5(c)). Simultaneously, impurities are removed from the surfaces of the layer 37 and the layer 39 to purify these surfaces.

The $Al_{0.7}Ga_{0.3}As$ layer 40 and the $Al_{0.4}Ga_{0.6}As$ layer 46 formed in this step are thermally stable at a temperature below about 680° C., seldom causing evaporation of the composing elements. Thus, the evaporation of In and P from these layers 37 and 39 which is normally active at around 620° C. can be avoided by being covered with these thin layers 40 and 46.

The substrate temperature at radiation of As molecular beams is not limited to 620° C. but can be about 580° C. or higher at which In evaporates to form the $Al_{0.7}Ga_{0.3}As$ layer 40 and the $Al_{0.4}Ga_{0.6}As$ layer 46. P also evaporates in the temperature range where In evaporates. Therefore, both In and P are replaced with As under radiation of a sufficient amount of As molecular beams to form the layer 40 and the layer 46. At this time, in order to maintain the layer 40 and the layer 46 stable throughout the above stage, the substrate temperature is preferably about 680° C. or lower.

Next, keeping the substrate temperature at about 600° C., the second conductivity type $Al_{0.7}Ga_{0.3}As$ regrowing clad layer 41 and the second conductivity type GaAs cap layer 42 are grown on the top surface of the layered substrate in such a manner that the stripe groove is filled up.

At this time, normally, the $(Al_{0.7}Ga_{0.3})_{0.5}In_{0.5}P$ etching stop layer 37 and the $(Al_{0.4}Ga_{0.6})_{0.5}In_{0.5}P$ etching stop layer 39 are significantly deteriorated caused by the evaporation of In and P therein at the temperature required to grow the second conductivity type regrowing clad layer 41. In this example, however, as described above, this deterioration can be avoided since these layers 37 and 39 are covered with the thermally stable $Al_{0.7}Ga_{0.3}As$ layer 40 and $Al_{0.4}Ga_{0.6}As$ layer 46, respectively.

The $Al_{0.7}Ga_{0.3}As$ regrowing clad layer 41 is formed to have a band gap energy greater than the energy of light beams generated in the active layer 35 by adjusting the Al content in the layer. The light beams generated in the active layer 35 can thus be confined within the double hetero structure.

Electrodes 45 and 44 are formed on the top surface of the layered structure and on the back surface of the substrate 31, respectively, to produce the index guided semiconductor laser device as shown in FIG. 5(d).

As described above, the semiconductor laser device of this example comprising the double hetero structure including the AlGaInP crystal layers can continuously radiate light beams of a wavelength of 670 nm at room temperature. Also, the index-guided semiconductor laser device having a stripe groove inside the device, can radiate the laser beams of the unified horizontal transverse mode.

Furthermore, the semiconductor laser device of this example is provided with the second conductivity type AlGaAs regrowing clad layer 41 including AlGaAs which has relatively high thermal conductivity, allowing heat generated in the active layer 35 to be efficiently diffused outside the semiconductor laser device. As a result, the semiconductor laser device of this example can show an excellent temperature property compared with the one shown in FIG. 8.

In this example, the $(Al_{0.7}Ga_{0.3})_{0.5}In_{0.5}P$ layer 37 and the $(Al_{0.4}Ga_{0.6})_{0.5}In_{0.5}P$ layer 39 were used as the etching stop layers. However, other composition ratio of AlGaInP than the above can also be used to form an AlGaInP etching stop layer which lattice-matches the substrate. This means that the lattice-matching with the substrate is possible for an etching stop layer formed of AlGaInP with an extensive variation of the composition ratio thereof, compared with, for example, AlGaAs. As a result, reduction of luminous efficiency caused by the failure in lattice-matching on the bottom portion of the stripe groove can be avoided, and laser beams of high optical output can be produced.

The AlGaAs layer formed on the surface of the AlGaInP layer is not liable to be contaminated by impurities such as oxygen compared with, for example, an AlAs layer not including Ga.

As a comparative example, a semiconductor laser device was produced by the same method as described above but excluding the step of radiating As molecular beams and raising the substrate temperature to 620° C. As a result, the threshold current increased and therefore continuous oscillation at room temperature was not possible. This is because the surface of the second conductivity type AlGaInP first etching stop layer 37 was not purified and failed to grow a high quality AlGaAs regrowing clad layer 41 thereon.

Incidentally, the $Al_{0.7}Ga_{0.3}As$ layer 40 and the $Al_{0.4}Ga_{0.6}As$ layer 46, being thin layers with a thickness of several molecules, do not give direct optical and electrical effects onto the properties of the semiconductor laser device.

The semiconductor laser device of this example is provided with the $(Al_{0.4}Ga_{0.6})_{0.5}In_{0.5}P$ layer as the second etching stop layer formed on the optical absorption layer 38. The crystallinity of the part of the AlGaAs regrowing layer 41 located above the optical absorption layer 38 then shows the same excellence as that of the part thereof grown above the stripe groove. However, the light beams generated in the active layer 35 are seldom transmitted into the part of the layer 41 located above the optical absorption layer 38, and therefore, a semiconductor laser device without the second etching stop layer 39 can obtain the same stable oscillation at room temperature as that of Example 5.

Example 6

Figure 6A:
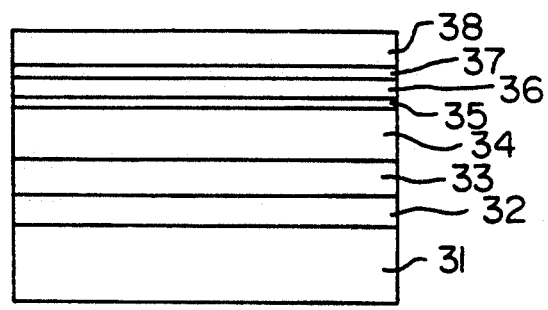
FIGS. 6(a) to 6(d) are sectional views showing the steps of the method for producing a semiconductor laser device of another embodiment according to the present invention.
Figure 6B:
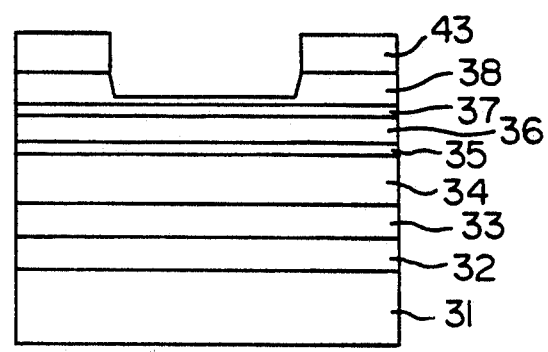
Figure 6C:
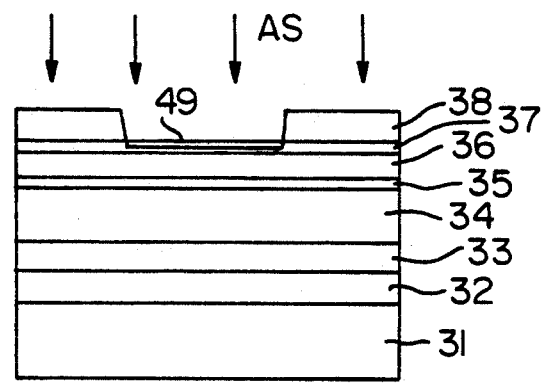
Figure 6D:
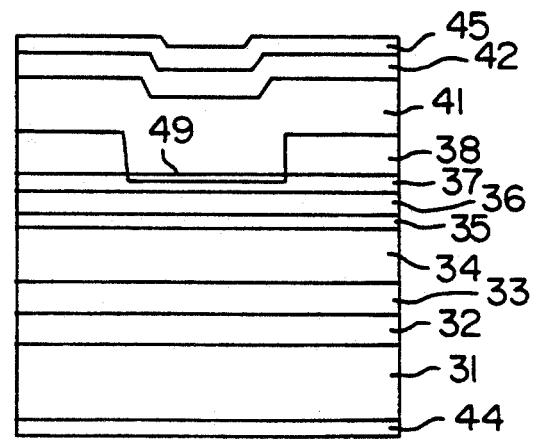

FIG. 6(d) is a sectional view of another example of the semiconductor laser device according to the present invention. The main differences between this example and Example 5 shown in FIG. 5(d) are that in this example the $(Al_{0.4}Ga_{0.6})_{0.5}In_{0.5}P$ layer is not formed on the optical absorption layer 38 and that an AlAs layer 49 is formed instead of the $Al_{0.7}Ga_{0.3}As$ layer 40 of Example 5 on the etching stop layer in the bottom portion of the stripe groove.

Referring to FIGS. 6(a) to 6(d), the method for producing the semiconductor laser device of this example is described as follows.

As shown in FIG. 6(a), a first conductivity type GaAs buffer layer 32, a first conductivity type GaInP buffer layer 33, a first conductivity type Al-GaInP first clad layer 34, a GaInP active layer 35, a second conductivity type AlGaInP second clad layer 36, an $(Al_{0.7}Ga_{0.3})_{0.5}In_{0.5}P$ etching stop layer 37 and a GaAs optical absorption layer 38 are formed on a first conductivity type GaAs substrate 31 in such a manner that one layer is grown on another in this order by the MBE method.

The total thickness of the second conductivity type AlGaInP second clad layer 36 and the second conductivity type $(Al_{0.7}Ga_{0.3})_{0.5}In_{0.5}P$ etching stop layer 37 is as small as about 250 nm so that light beams generated in the active layer 35 can be transmitted to the GaAs optical absorption layer 38.

Then, after the layered substrate 31 is taken out of the MBE apparatus, some portion of the GaAs optical absorption layer 38 is selectively etched using a photo mask 43 to form a stripe groove with the depth not to reach the $(Al_{0.7}Ga_{0.3})_{0.5}In_{0.5}P$ etching stop layer 37 (FIG. 6(b)), remaining an about 100 nm thick GaAs layer between the bottom surface of the stripe and the top surface of the etching stop layer 37.

Next, the layered substrate is returned to the MBE apparatus where the layered substrate 31 covered with the GaAs layer is exposed to a sufficient amount of As molecular beams while the substrate temperature is raised to 720° C. The condition is maintained for several minutes.

By this operation, the GaAs remaining in the bottom portion of the stripe groove evaporates, and Ga, In and P present near the surface of the resultantly exposed $(Al_{0.7}Ga_{0.3})_{0.5}In_{0.5}P$ etching stop layer 37 are replaced with As in the As molecular beams, changing the portions near the surface of the layer 37 to an AlAs layer 49 of a thickness of several molecules (FIG. 6(c)).

This thin AlAs layer 49 is thermally stable at about 720° C., not causing eminent evaporation of the composing elements. Thus, the evaporation of In and P from $(Al_{0.7}Ga_{0.3})_{0.5}In_{0.5}P$ etching stop layer 37 which is normally active at around 720° C. is avoided by being covered with this AlAs layer 49.

In this example, the substrate temperature during the above step was 720° C., but in order to form the AlAs layer 49 it may be about 680° C. or higher at which Ga and As evaporate. In and P also evaporate in the temperature range where Ga and As evaporate. Therefore, Ga, In and P present in the exposed portion of the $(Al_{0.7}Ga_{0.3})_{0.5}In_{0.5}P$ layer 37 are replaced with As under radiation of a sufficient amount of As molecular beams to form the AlAs layer 49. At this time, in order to maintain the stability of the AlAs layer 49 throughout the above stage, the substrate temperature is preferably about 740° C. or lower.

Thus, by forming the stripe groove so that some thickness of the GaAs layer remains in the bottom portion of the stripe groove, the surface of the $(Al_{0.7}Ga_{0.3})_{0.5}In_{0.5}P$ layer 37 is not exposed to the atmosphere, preventing it from being contaminated. Also, the surface of the GaAs layer contaminated by the exposition to the atmosphere can be purified by evaporating near the surface of the GaAs layer in the MBE apparatus.

Moreover, the AlAs layer 49 can prevent deterioration of the $(Al_{0.7}Ga_{0.3})_{0.5}In_{0.5}P$ layer 37 caused by the evaporation of In and P which is normally active at a temperature about 580° C. or higher.

After the above step, a second conductivity type $Al_{0.7}Ga_{0.3}As$ regrowing clad layer 41 and a second conductivity type GaAs cap layer 42 are formed on the top surface of the layered substrate 31 in this order. The Al contain in the $Al_{0.7}Ga_{0.3}As$ regrowing clad layer 41 is determined so that the refractive index is low enough to confine the light beams generated in the active layer 35 within the same layer 35.

Electrodes 45 and 44 are formed on the top face of the multi-layered structure and on the back surface of the substrate 31, respectively, to produce the index-guided semiconductor laser device as shown in FIG. 6(d).

Example 7

Figure 7A:
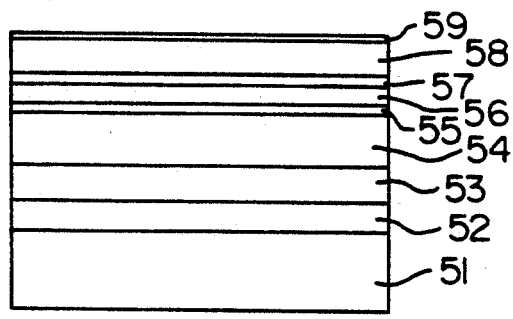
FIGS. 7(a) to 7(d) are sectional views showing the steps of the method for producing a semiconductor laser device of still another embodiment according to the present invention.
Figure 7B:
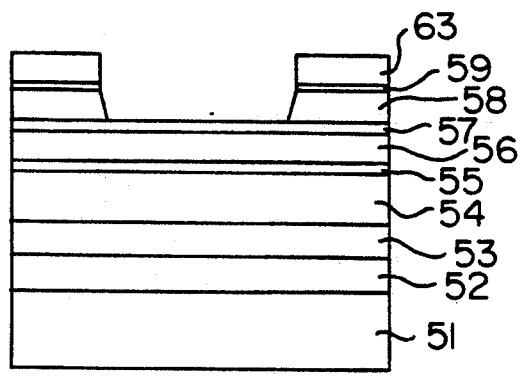
Figure 7C:
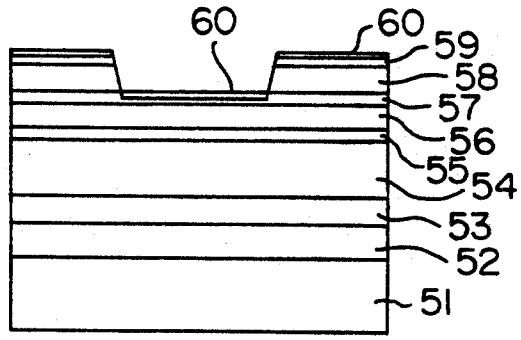
Figure 7D:
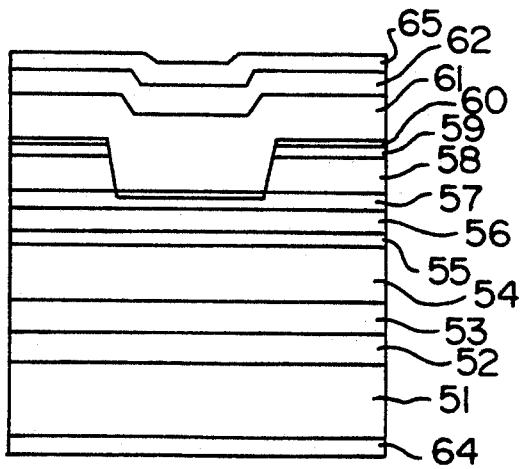

FIG. 7(d) is a sectional view of still another example of the semiconductor laser device according to the present invention.

The semiconductor laser device comprises a first conductivity type GaAs buffer layer 52, a first conductivity type GaInP buffer layer 53, a first conductivity type AlGaInP first clad layer 54, a GaInP active layer 55, a second conductivity type AlGaInP second clad layer 56 (150 nm thickness), a GaInP first etching stop layer 57 (7 nm thickness), a GaAs optical absorption layer 58 and a GaInP second etching stop layer 59 formed on a first conductivity type GaAs substrate 51 in this order.

The first conductivity type AlGaInP first clad layer 54, the GaInP active layer 55 and the second conductivity type AlGaInP second clad layer 56 constitute a double hetero structure.

A stripe groove (5 μm width) is formed through the GaInP second etching stop layer 59 and the GaAs optical absorption layer 58 to reach the surface of the GaInP first etching stop layer 57.

A second conductivity type $Al_{0.7}Ga_{0.3}As$ regrowing clad layer 61 is formed over the layered structure in such a manner that the stripe groove is filled up. The Al content in the $Al_{0.7}Ga_{0.3}As$ regrowing clad layer 61 is determined so that the refractive index is low enough (about 3.3) to confine the light beams generated in the active layer 55 within the double hetero structure. The thermal conductivity of this regrowing clad layer 61 is about 0.1 W/cm.deg.

On the regrowing clad layer 61 is formed a second conductivity type GaAs cap layer 62. Electrodes 65 and 64 are formed on the top surface of the cap layer 62 and the back surface of the substrate 51, respectively.

Next, referring to FIGS. 7(a) to 7(d), the method for producing the semiconductor laser device of this example is described as follows.

As shown in FIG. 7(a), the first conductivity type GaAs buffer layer 52, the first conductivity type GaInP buffer layer 53, the first conductivity type AlGaInP first clad layer 54, the GaInP active layer 55, the second conductivity type AlGaInP second clad layer 56, the GaInP first etching stop layer 57, the GaAs optical absorption layer 58 and the GaInP second etching stop layer 59 are formed on the first conductivity type GaAs substrate 51 in such a manner that one layer is grown on another in this order. The substrate temperature at growing the layers is in the range of about 450° C. and about 570° C.

During the above step of growing each layer, the substrate 51 should not be moved outside the MBE apparatus in order to keep the growing layers clean.

The thickness of the second conductivity type AlGaInP second clad layer 56 is as small as about 150 nm so that light beams generated in the active layer 55 can be transmitted to the GaAs optical absorption layer 58.

Then, after the layered substrate 51 is taken out of the MBE apparatus, some portion of the GaInP second etching stop layer 59 and the GaAs optical absorption layer 58 is selectively etched using a photo mask 63 to form a stripe groove extending to reach the GaInP first etching stop layer 57 (FIG. 7(b)).

After this step of etching, impurities such as oxygen and steam in the atmosphere attach the surface of the GaInP first etching stop layer 57.

After the layered substrate 51 is returned to the MBE apparatus, the GaInP layers 57 and 59 are exposed to a sufficient amount of As molecular beams so as to purify the surfaces thereof while the substrate temperature is raised to 620° C. The condition is maintained for several minutes.

By this operation, In and P present near the surfaces of the GaInP first etching stop layer 57 and the GaInP second etching stop layer 59 are replaced with As in the As molecular beams, changing the portions near the surfaces of these layers 57 and 59 to a GaAs layer 60 of a thickness of several molecules (FIG. 7(c)).

Simultaneously, impurities are removed from the surfaces of the GaInP layers 57 and 59 and these surfaces are purified. Further, the GaAs layer 60 is thermally stable seldom causing evaporation of composing elements at a temperature below about 680° C. Thus, evaporation of In and P from these layers 57 and 59, which is normally active at around 620° C., is avoided by being covered with the layer 60.

The substrate temperature at the stage of forming the GaAs layer 60 is not limited to 620° C. but can be about 580° C. or higher at which In evaporates to form the GaAs layer 60. P also evaporates in the temperature range where In evaporates. Therefore, both In and P are replaced with As under radiation of a sufficient amount of As molecular beams to form the GaAs layer 60. At this time, in order to maintain the stability of the GaAs layer 60 throughout the above stage, the substrate temperature is preferably about 680° C. or lower.

Thus, by forming the GaAs layer 60, the deterioration of the GaInP layers 57 and 59 caused by evaporation of In and P therein which is especially eminent at a temperature of about 580° C. or higher can be avoided at a temperature of about 680° C.

Next, keeping the substrate temperature at about 680° C., a second conductivity type $Al_{0.7}Ga_{0.3}As$ regrowing clad layer 61 and a second conductivity type GaAs cap layer 62 are grown on the top surface of the layered substrate in such a manner that the stripe groove is filled up. At this time, normally, the GaAs layers 57 and 59 are significantly deteriorated caused by the evaporation of In and P therein at the temperature required to grow the $Al_{0.7}Ga_{0.3}As$ regrowing clad layer 61. In this example, however, this deterioration can be avoided since these layers 57 and 59 are covered with the thermally stable GaAs layer 60.

The $Al_{0.7}Ga_{0.3}As$ regrowing clad layer 61 is formed to have a band gap energy (2.1 eV) greater than the energy of light beams (about 1.9 eV) generated in the active layer 55 by adjusting the Al content in the layer. The light beams generated in the active layer 55 can thus be confined within the double hetero structure.

The band gap energy of the GaAs layer 58 having the stripe groove therethrough is smaller than the energy of light beams generated in the active layer 55, which light beams are therefore easily absorbed by the GaAs layer 58. As a result, an effective difference of the refractive indexes between the inside and the outside of the stripe groove located above the double hetero structure is produced, and thus the horizontal transverse mode of laser beams is unified.

Electrodes 65 and 64 are formed on the top surface of the multi-layered structure and on the back surface of the substrate 51 to produce the index-guided semiconductor laser device as shown in FIG. 7(d).

The semiconductor laser device of this example can continuously radiate 670 nm wavelength light beams at room temperature, wherein the horizontal transverse mode of laser beams is unified.

The GaAs layer 60, being a thin layer of a thickness of several molecules, does not directly give optical and electrical effects onto the properties of the semiconductor laser device.

The semiconductor laser device of this example is provided with the second conductivity type AlGaAs regrowing clad layer 61 including AlGaAs which has relatively high thermal conductivity, allowing heat generated in the active layer 55 to be efficiently diffused outside the semiconductor laser device. As a result, the semiconductor laser device of this example can show an excellent temperature property compared with the one shown in FIG. 8.

As a comparative example, a semiconductor laser device was produced by the same producing method described above but excluding the step of radiating As molecular beams and raising the substrate temperature to 620° C. In this comparative example, the threshold current increased and continuous oscillation at room temperature was not possible. This is because the surface of the second conductivity type GaInP first etching stop layer 57 was not purified, failing in growing a high quality AlGaAs regrowing clad layer thereon.

The semiconductor laser device of this example is provided with the GaInP layer as the second etching stop layer 59 formed on the GaAs layer 60. The crystallinity of the part of the AlGaAs regrowing layer 61 located above the optical absorption layer 58 then shows the same excellence as that of the part thereof grown above the stripe groove where the optical absorption layer 58 is removed. However, the light beams generated in the active layer 55 are seldom transmitted into the part of the layer 61 located above the optical absorption layer 58, and, therefore, a semiconductor laser device without the second etching stop layer 59 can obtain the same stable oscillation at room temperature as that of Example 7. However, in this case, as the crystallinity in the part of the AlGaAs regrowing layer 61 located above the optical absorption layer 58 is inferior compared with Example 7, the threshold current slightly increases. It is preferable therefore to also provide the GaInP second etching stop layer 59 on the optical absorption layer 58 so as to obtain a semiconductor laser device capable of stably oscillating at room temperature with the low threshold current.

The GaInP first etching stop layer 57 of this example is 7 nm thick. It was found that a semiconductor laser device having the layer of a thickness of 20 nm failed to stably oscillate at room temperature. The reason is that when the thickness of the GaInP first etching stop layer 57 is large compared with the de Broglie wavelength, the optical absorption of the layer 57 increases, which increases the waveguide loss and therefore raises the threshold current.

For the above reason, in order to continuously oscillate the visible light beams at room temperature, the thickness of the GaInP first etching stop 57 must be smaller than the electronic de Broglie wavelength. Practically, the thickness is preferably in the range of about 3 nm and about 15 nm.

In this case, the band gap energy of the GaInP first etching stop layer 57 can be made greater than that of the active layer 55 by forming a quantum state in the layer 57, so as to reduce the optical absorption.

The GaInP layer used as the etching stop layers which does not include the active Al has an advantage of being less contaminated by oxygen, steam and the like than the AlGaInP layer. Therefore, the semiconductor laser device of this example which has the GaInP etching stop layers disposed above the double hetero structure including AlGaInP layers is advantageous in being less contaminated during the producing process and also being capable of continuously oscillating visible light beams at room temperature.

In this example, a layer made of GaAs was used as the optical absorption layer 58, but other materials which easily absorb the light beams generated in the active layer 55 such as AlGaAs may also be used.

In the semiconductor laser devices of Examples 5, 6 and 7, the double hetero structure are composed of the first conductivity type AlGaInP first clad layer, the GaInP active layer and the second conductivity type AlGaInP second clad layer. It is possible that the structure may be formed of semiconductor layers of other compositions of the AlGaInP group: for example, layers formed of an AlInP three element mixed crystal as the first and the second clad layers, a layer formed of an AlGaInP four element mixed crystal as the active layer, or a layer having the quantum well structure or the superlattice structure can be used. An SCH structure can also be formed by providing between the clad layers and the active layer a guide which is small in gain and absorption loss.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser device comprising:
   a GaAs substrate,
   a double hetero structure composed of AlGaInP crystals formed on said GaAs substrate,
   an $(Al_XGa_{1-X})_{0.5}In_{0.5}P$ etching stop layer $(0 \leq X \leq 1)$
   a GaAs optical absorption layer formed on said etching stop layer and having a strip groove extending therethrough to reach said etching stop layer,
   an AlGaAs layer of a thickness of several molecules formed in the strip groove;
   a regrowing AlGaAs layer formed on said etching stop layer and said GaAs optical absorption layer in such a manner so as to fill up said strip groove; and
   an electrode formed beneath said GaAs substrate and an electrode formed on said layers;
   wherein said etching stop layer and said regrowing AlGaAs layer have a band gap energy greater than an optical energy generated within said double hetero structure.

2. A semiconductor laser device comprising:
   a GaAs substrate, a double hetero structure composed of AlGaInP crystals formed on said GaAs substrate, an $(Al_xGa_{1-x})_{0.5}In_{0.5}P$ etching stop layer ($0 \leq X \leq 1$) formed on said double hetero structure, a GaAs optical absorption layer formed on said etching stop layer and having a stripe groove extending therethrough to reach said etching stop layer, a regrowing AlGaAs layer formed on said etching stop layer and said GaAs optical absorption layer in such a manner so as to fill up said stripe groove; and an electrode formed beneath said GaAs substrate and an electrode formed on said layers;

wherein said etching stop layer and said regrowing AlGaAs layer have a band gap energy greater than an optical energy generated within said double hetero structure, wherein another $(Al_yGa_{1-y})_{0.5}In_{0.5}P$ etching stop layer ($0 \leq X \leq 1$) is formed between the top surface of said GaAs optical absorption layer and the bottom surface of said AlGaAs layer.

3. A semiconductor laser device comprising:

a GaAs substrate, a double hetero structure formed on said GaAs substrate and composed of AlGaInP crystal layers which lattice-match with said GaAs substrate, a GaInP etching stop layer formed on said double hetero structure, an optical absorption layer formed on said GaInP etching stop layer and having a stripe groove extending therethrough to reach said GaInP etching stop layer, a GaAs layer of a thickness of several molecules formed in the strip groove;

an AlGaAs layer formed on said optical absorption layer and said GaInP etching stop layer, and an electrode formed beneath said GaAs substrate and an electrode formed on said layers;

wherein the thickness of said GaInP etching stop layer is smaller than an electron de Broglie wavelength, and the band gap energy of said AlGaAs layer is greater than an optical energy generated within said double hetero structure.

4. A semiconductor laser device comprising:

a GaAs substrate, a double hetero structure formed on said GaAs substrate and composed of AlGaInP crystal layers which lattice-match with said GaAs substrate, a GaInP etching stop layer formed on said double hetero structure, an optical absorption layer formed on said GaInP etching stop layer and having a stripe groove extending therethrough to reach said GaInP etching stop layer, an AlGaAs layer formed on said optical absorption layer and said GaInP etching stop layer, and an electrode formed beneath said GaAs substrate and an electrode formed on said layers;

wherein the thickness of said GaInP etching stop layer is smaller than an electron de Broglie wavelength, and the band gap energy of said AlGaAs layer is greater than an optical energy generated within said double hetero structure, wherein a second GaInP etching stop layer is formed on said optical absorption layer.

* * * * *

UNITED STATES PATENT AND TRADEMARK OFFICE
CERTIFICATE OF CORRECTION

PATENT NO. : 5,255,279
DATED : October 19, 1993
INVENTOR(S) : Takahashi et al.

It is certified that error appears in the above-identified patent and that said Letters Patent is hereby corrected as shown below:

Column 18,

Claim 1, line 5 expression

"$(Al_xGa_{1-x})_{0.5}in_{0.5}P$" should read

--$(Al_xGa_{1-x})_{0.5}In_{0.5}P$--;

Claim 1 lines 10 and 13 term

"strip" should read --stripe--.

Signed and Sealed this

Twenty-fourth Day of May, 1994

BRUCE LEHMAN

*Attest:*

*Attesting Officer*    *Commissioner of Patents and Trademarks*